United States Patent
Nakamura et al.

(10) Patent No.: US 9,315,921 B2
(45) Date of Patent: Apr. 19, 2016

(54) HIGH HEAT-RESISTANT MEMBER, METHOD FOR PRODUCING THE SAME, GRAPHITE CRUCIBLE AND METHOD FOR PRODUCING SINGLE CRYSTAL INGOT

(75) Inventors: Daisuke Nakamura, Nagoya (JP); Akitoshi Suzumura, Nagakute (JP); Keisuke Shigetoh, Nagoya (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 756 days.

(21) Appl. No.: 13/617,671

(22) Filed: Sep. 14, 2012

(65) Prior Publication Data
US 2013/0061800 A1  Mar. 14, 2013

(30) Foreign Application Priority Data

Sep. 14, 2011 (JP) .................... 2011-200283
Aug. 10, 2012 (JP) .................... 2012-177799

(51) Int. Cl.
*C30B 23/06* (2006.01)
*C30B 35/00* (2006.01)
*C09D 1/00* (2006.01)

(52) U.S. Cl.
CPC ............... *C30B 35/002* (2013.01); *C09D 1/00* (2013.01); *C30B 23/06* (2013.01); *Y10T 428/26* (2015.01)

(58) Field of Classification Search
CPC .... C30B 35/002; C30B 23/06; Y10T 428/26; C09B 1/00
See application file for complete search history.

(56) References Cited

U.S. PATENT DOCUMENTS

| 6,890,600 | B2 * | 5/2005 | Nakamura et al. ......... 423/328.2 |
| 2007/0105706 | A1 * | 5/2007 | Chen et al. ...................... 501/87 |
| 2010/0239885 | A1 | 9/2010 | Nakamura |

FOREIGN PATENT DOCUMENTS

| JP | A-10-236892 | 9/1998 |
| JP | A-10-245285 | 9/1998 |
| JP | 2004084057 A * | 3/2004 |
| JP | A-2004-084057 | 3/2004 |
| JP | A-2007-308369 | 11/2007 |
| JP | A-2007-332024 | 12/2007 |
| JP | A-2010-248060 | 11/2010 |

OTHER PUBLICATIONS

Okazaki, "Ceramic Dielectric Engineering (Ceramic Yudentai Kougaku)," pp. 586-593, Gakken-sha, Japan (with partial translation).

* cited by examiner

*Primary Examiner* — Robert M Kunemund
(74) *Attorney, Agent, or Firm* — Oliff PLC

(57) ABSTRACT

A high heat-resistant member includes a graphite substrate including isotropic graphite and a carbide coating film including a carbide, such as tantalum carbide, and covering a surface of the graphite substrate, the carbide coating film having a randomly oriented isotropic grain structure in which crystallites having a size indexed by a full width at half maximum of a diffraction peak of an X-ray diffraction pattern of not more than 0.2° from (111) planes are accumulated at substantially random. The orientation of the carbide coating film is determined by whether degree of orientation (F) in any Miller plane calculated based on an XRD pattern using the Lotgering method is within a range from −0.2 to 0.2.

7 Claims, 8 Drawing Sheets

| D | Detector |
| --- | --- |
| RS | Receiving Slit |
| SoS | Soller Slits (5°) |
| ScS | Scattering Slit |
| DS | Divergence Slit |
| X | X-ray Source |

| RS | Receiving Slit |
| --- | --- |
| ScS | Scattering Slit |
| DS | Divergence Slit |
| X | X-ray Source |

| D | Detector |
|---|---|
| M | Monochromator (Graphite Crystal) |
| RS | Receiving Slit |
| SoS | Soller Slits (5°) |
| ScS | Scattering Slit |
| DS | Divergence Slit |
| X | X-ray Source |

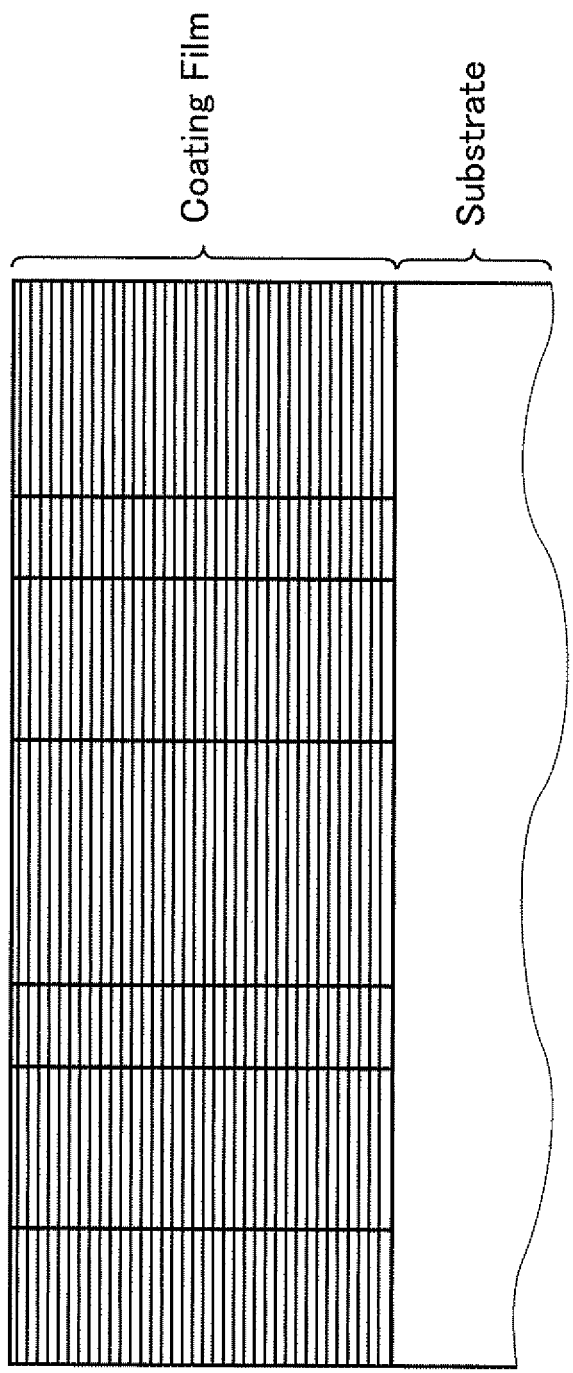

HIGH HEAT-RESISTANT MEMBER, METHOD FOR PRODUCING THE SAME, GRAPHITE CRUCIBLE AND METHOD FOR PRODUCING SINGLE CRYSTAL INGOT

CROSS-REFERENCE TO RELATED APPLICATIONS

This application is based upon and claims the benefit of priority from the prior Japanese Patent Application No. 2011-200283 filed on Sep. 14, 2011, and No. 2012-177799 filed on Aug. 10, 2012, the entire contents of which are incorporated herein by reference.

BACKGROUND ART

1. Field of the Invention

The present invention relates to a high heat-resistant member including a graphite substrate having a surface covered with a carbide coating film, and a method for producing the same. The present invention also relates to a graphite crucible including the high heat-resistant member, and a method for producing a single crystal ingot using the graphite crucible.

2. Description of the Related Art

When a wafer of single crystal silicon carbide (SiC), gallium nitride (GaN) or the like is produced by sublimation (recrystallization) or other techniques, a seed crystal for single crystal and raw material powder (e.g., SiC powder) placed so as to face each other need to be heated at 2,000 to 2,400 deg. C. in an inert atmosphere. In this case, members capable of withstanding high temperatures are necessary and high heat-resistant members such as graphite heaters and graphite crucibles including (isotropic) graphite substrates have been used.

When a high heat-resistant member including an as-produced graphite substrate is used in a reducing atmosphere at high temperatures, the graphite substrate reacts with the reducing gas and decreases in weight, so durability of the high heat-resistant member decreases remarkably and there arises a risk that impurities are mixed in a product (single crystal).

In order to reduce these problems, the following patent literature and others proposed to shield the graphite substrate for protection from an external environment by covering a surface of the graphite substrate constituting a high heat-resistant member with a metal carbide (e.g. tantalum carbide) having a ultrahigh melting point.

PATENT LITERATURE

[PTL 1] Japanese Unexamined Patent Publication No. 10-236892 (Japanese Unexamined Patent Publication No. 2007-332024)
[PTL 2] Japanese Unexamined Patent Publication No. 10-245285 (Japanese Unexamined Patent Publication No. 2007-308369)
[PTL 3] Japanese Unexamined Patent Publication No. 2004-84057
[PTL 4] Japanese Unexamined Patent Publication No. 2010-248060

SUMMARY OF THE INVENTION

PTL 1 and PTL 2 proposed to form a tantalum carbide coating film on an isotropic graphite substrate by reacting fine particles of a target (Ta) and molecules of a reactive gas ($CH_4$) by arc ion plating (AIP) reactive vapor deposition.

PTL 1 and PTL 2 disclose that the tantalum carbide coating film formed by AIP has a crystalline structure in which fine particles are densely deposited and that this tantalum carbide coating film is more suppressed from crack developing and peeling than a tantalum carbide coating film formed by chemical vapor reaction (CVR). However, the present inventors' research showed that this tantalum carbide coating film has a (200)-oriented crystalline structure and does not have a sufficiently high durability.

PTL 3 proposed to form a TaC layer on an isotropic graphite substrate by chemical vapor deposition (CVD). PTL 3 mentions that this TaC layer has low anisotropy and is suppressed from generating cracks or other damages. As shown in its preferred embodiments, however, the TaC layer had a full width at half maximum (FWHM) of a strongest X-ray diffraction (XRD) peak of not less than $0.4°$, which indicates that the structure of the TaC layer was close to an amorphous phase. The TaC layer in such an amorphous phase is unstable and may undergo crystallization, that is, make a structural change at high temperatures. Therefore, when used in a high temperature environment, the TaC layer makes a structural change and generates cracks and pores. Accordingly, it is difficult for such a TaC layer as that of PTL 3 to protect a graphite substrate from a reducing gas or the like for a long time.

PTL 4 proposed to form a tantalum carbide coating film on a graphite substrate by coating a slurry of TaC powder on the graphite substrate and then drying and sintering the coating. This tantalum carbide coating film has a higher durability than those of the abovementioned coating films, but has room for improvement in durability because of its oriented crystalline structure.

The present invention has been made in view of these circumstances. It is an object of the present invention to provide a high heat-resistant member with good durability including a graphite substrate protected by a carbide coating film which does not easily crack or peel off even when used in a high temperature environment, and a method for producing the same. It is also an object of the present invention to provide a graphite crucible including the high heat-resistant member and a method for producing a single crystal ingot using the graphite crucible.

The present inventors have earnestly studied and made trial and error in order to attain this object. As a result, the present inventors have succeeded in forming, on a surface of a graphite substrate, a tantalum carbide coating film having a crystalline structure in which respective crystal grains are accumulated at random, and have confirmed that this tantalum carbide coating film exhibits good durability even in a high temperature environment. The present inventors have made further research on this success and have completed the present invention mentioned below.

High Heat-Resistant Member

A high heat-resistant member of the present invention includes a graphite substrate including isotropic graphite; and a carbide coating film including a carbide and covering a surface of the graphite substrate; the carbide coating film having a randomly oriented (i.e. isotropic) grain structure in which (crystal grains having) crystallites having a size indexed by a full width at half maximum of a diffraction peak of an XRD pattern of not more than $0.2°$ from (111) planes are accumulated at substantially random.

Method for Producing High Heat-Resistant Member

The present invention can be grasped not only as a high heat-resistant member but also as a method for producing the same. That is to say, the present invention can be grasped as a method for producing the abovementioned high heat-resistant member including a coating step of coating a slurry containing carbide particles on a surface of a graphite substrate including isotropic graphite, and a film-forming step of forming a carbide coating film including sintered carbide particles by heating the graphite substrate after the coating step.

Graphite Crucible and Method for Producing Single Crystal Ingot

In addition, the present invention can be grasped as a graphite crucible characteristically including the abovementioned high heat-resistant member.

Furthermore, the present invention can also be grasped as a method for producing a single crystal ingot using the graphite crucible. That is to say, the present invention can be a method for producing a single crystal ingot, including a placing step of placing a seed crystal and a raw material in the abovementioned graphite crucible in a manner to face each other, and a heating step of heating the raw material in an inert atmosphere so as to sublime the raw material, thereby obtaining a single crystal ingot including single crystal grown from the seed crystal.

Others (1) The carbide coating film and the graphite substrate mentioned herein can contain reforming elements, which are effective in improving their characteristics, and inevitable impurities (elements), which are difficult to be removed for cost, technical or other reasons.

(2) A range "x to y" mentioned herein includes the lower limit value x and the upper limit value y unless otherwise specified. Moreover, a new numerical range such as "a to b" can be made by using a variety of numerical values or any given numerical values included in a variety of numerical ranges mentioned herein as a lower limit value or an upper limit value.

BRIEF DESCRIPTION OF THE DRAWINGS

FIG. 4B is an explanatory diagram schematically illustrating a structure of a conventional carbide coating film.

DETAILED DESCRIPTION OF THE INVENTION

Figure 1A:
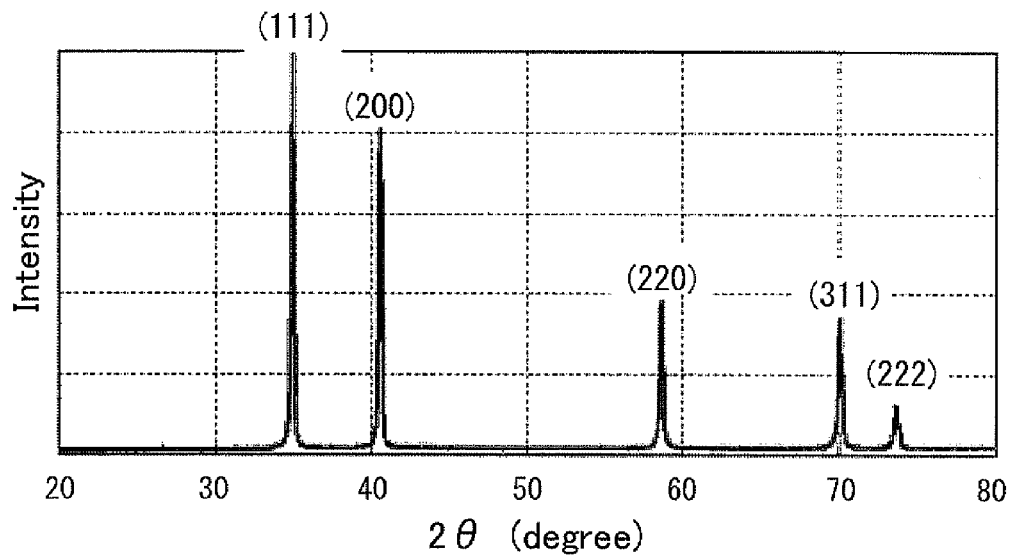
FIG. 1A is an XRD pattern of specimen No. 1.
Figure 1B:
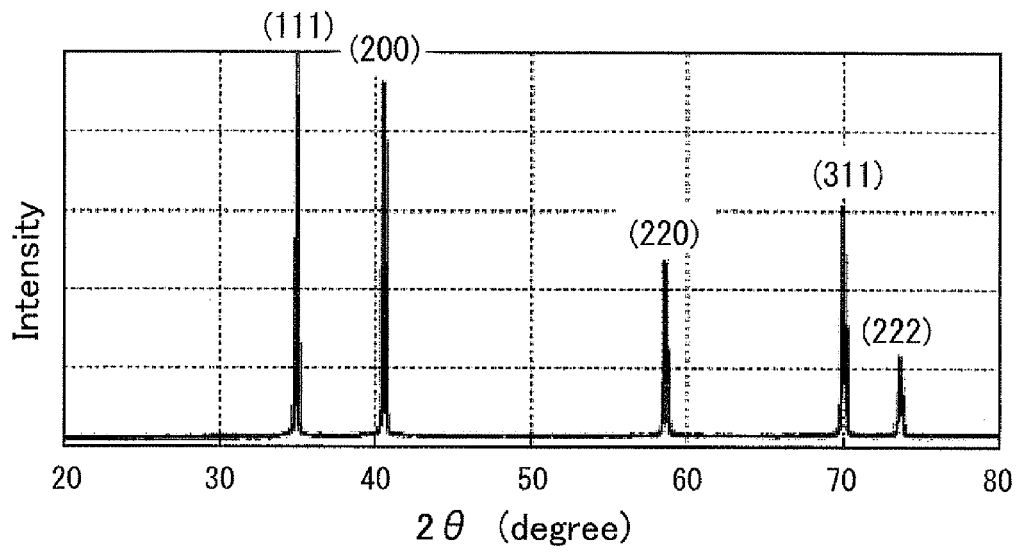
FIG. 1B is an XRD pattern of specimen No. 2.
Figure 1C:
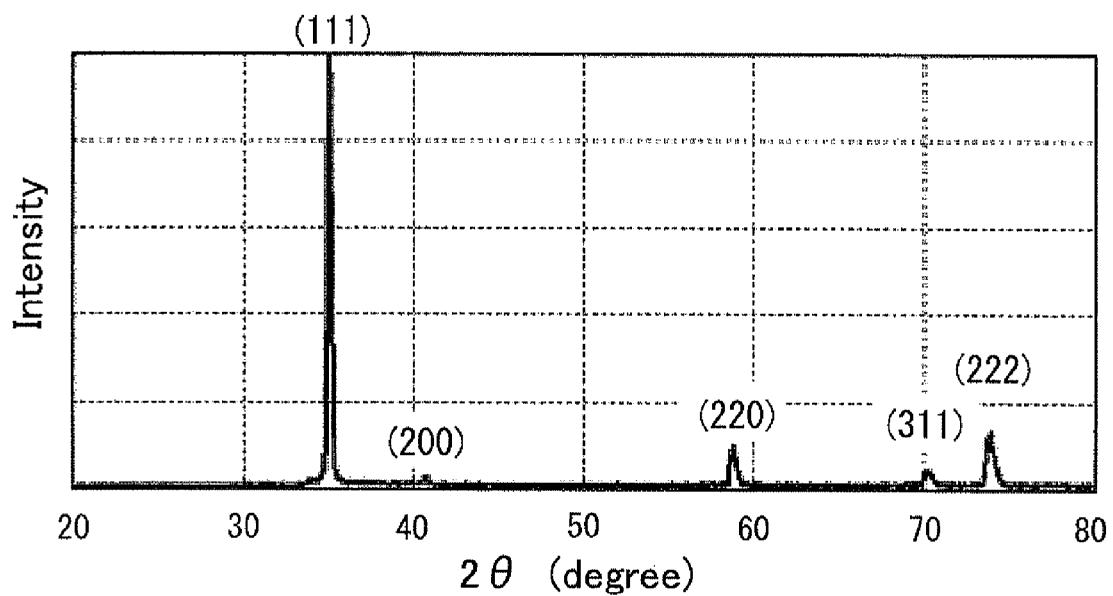
FIG. 1C is an XRD pattern of specimen No. C1.
Figure 1D:
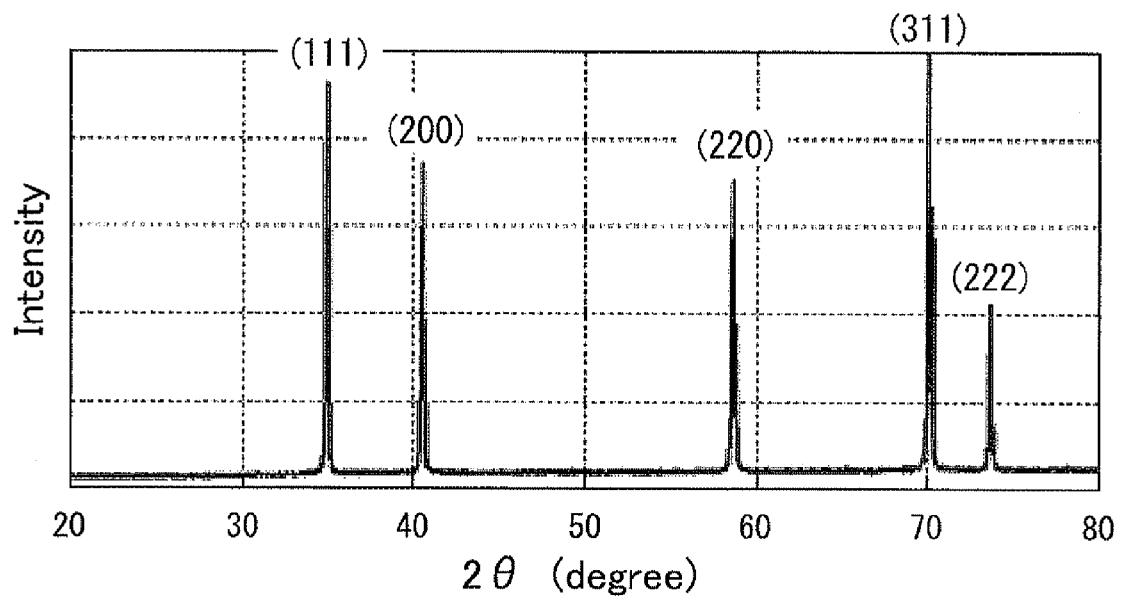
FIG. 1D is an XRD pattern of specimen No. C2.

What is mentioned in the description of the present invention can be applied not only to the high heat-resistant member of the present invention but also the method for producing the same. Constitutional elements of the production method can be constitutional elements of a product when it is assumed that the product is a product by the process. Any one or more constitutional elements selected from those mentioned herein can be added to the abovementioned constitutional elements of the present invention. Which embodiment is best depends on application targets, required performance and so on.

High Heat-Resistant Member (1) A high heat-resistant member according to the embodiment of the present invention includes a graphite substrate including isotropic graphite; and a carbide coating film including a carbide and covering a surface of the graphite substrate; the carbide coating film having a randomly oriented isotropic grain structure in which (crystal grains having) crystallites having a size indexed by a full width at half maximum of a diffraction peak of an XRD pattern of not more than 0.2° from (111) planes are accumulated at substantially random.

(2) The high heat-resistant member according to the embodiment of the present invention includes an isotropic graphite substrate having a surface covered with a carbide coating film, and the carbide coating film has a randomly oriented isotropic grain structure in which a number of crystal grains (or crystallites) having a predetermined size are accumulated at substantially random. Even when used in a high-temperature atmosphere including a reducing gas, a reactive gas or the like for a long time, this carbide coating film is free from damages such as surface cracks and peeling and exhibits stable barrier properties so as to protect the graphite substrate. As a result, the high heat-resistant member according to the embodiment of the present invention can exhibit good heat resistance, durability and so on even in a high-temperature environment. Upon using the high heat-resistant member of the present invention, it is possible to stably produce high-quality single crystals, etc. and reduce their production costs.

(3) By the way, the reason why the carbide coating film of the present invention has good durability (a good high-temperature durability) in a high-temperature reducing gas atmosphere is not all clear but at present it is supposed as follows.

First of all, the carbide coating film according to the embodiment of the present invention has a crystalline structure having the aforementioned FWHM of not more than 0.2°, and high crystallinity, and includes crystallites (and crystal grains) having a large size. It can be said from these that the carbide coating film of the present invention has an isotropic grain structure constituted by crystal grains which have grown to a certain size or greater. In this respect, the carbide coating film of the present invention is stable without undergoing any great structural change associated with crystallization, unlike a carbide coating film having an amorphous structure or an ultrafine crystalline structure which is close to an amorphous structure.

It should be noted that a crystallite is a maximum unit which can be regarded as single crystal. The crystallite size is indexed by the abovementioned FWHM. It can be said that as the FWHM is smaller, crystallinity is higher and the crystallite size is larger. The crystallite size is not always identical with the crystal grain size (the crystal grain diameter), but there is a relation between these two sizes and generally it can be said that as crystallites are larger, crystal grains are larger.

Second, the carbide coating film according to the embodiment of the present invention has a randomly oriented isotropic grain structure. That is to say, crystallographic axis directions of respective crystallites (or respective crystal grains) constituting the carbide coating film are distributed at random. Therefore, when viewed as a whole, the carbide coating film of the present invention has an isotropic crystalline structure and isotropic physical and other characteristics. Specifically speaking, thermal or mechanical stress almost uniformly acts on the entire carbide coating film, and physical, chemical and mechanical characteristics of the film are isotropic. For example, even when a thermal or mechanical impact acts on the carbide coating film, the force of impact is absorbed by the entire carbide coating film and defects such as cracks hardly occur. Even if a defect such as microcracks occurs in the carbide coating film, developing of the defect is blocked (the microcracks are pinned) by crystal grains surrounding the defect, because the carbide coating film has an isotropic grain structure in which crystal grains having randomly-oriented crystallographic axis directions are accumulated. That is to say, it can be said that a defect such as cracks is very difficult to propagate in the carbide coating film of the present invention.

As just described, a defect such as cracks hardly occurs in the carbide coating film of the present invention in the first place, and even if micro defects occur, the micro defects do not develop. Therefore, the carbide coating film of the present invention exhibits good crack resistance, peeling resistance and barrier durability properties. This is believed to be the reason why the high heat-resistant member of the present invention including a graphite substrate covered with this carbide coating film also exhibits good heat resistance and durability.

Method for Producing High Heat-Resistant Member (1) The present invention can be grasped not only as a high heat-resistant member but also as a method for producing the same. That is to say, the present invention can be grasped as a method for producing the abovementioned high heat-resistant member including a coating step of coating a slurry containing carbide particles on a surface of a graphite substrate including isotropic graphite, and a film-forming step of forming a carbide coating film including sintered carbide particles by heating the graphite substrate after the coating step.

(2) The production method of the present invention allows easy formation of a carbide coating film having a randomly oriented isotropic grain structure on a graphite substrate. Besides, since the production method of the present invention basically only needs to coat a slurry and then (dry and) sinter the coating, the production method can easily be applied to graphite substrates having a variety of shapes, that is to say, have a high flexibility in application. Therefore, the production method of the present invention can provide the abovementioned high heat-resistant member at low costs.

Carbide Coating Film (1) Full Width at Half Maximum

Size of crystallites constituting the carbide coating film according to the embodiment of the present invention is indexed by full width at half maximum (FWHM). The FWHM is greater as crystallinity decreases (the crystalline structure is closer to an amorphous phase), crystallites are finer, and a variation in composition is wider, etc. However, when composition is stable, crystallinity is good, and crystallites have a considerably large size as in the carbide coating film according to the embodiment of the present invention, the FWHM falls within a certain range. Therefore, the FWHM is most appropriate as an index for specifying the carbide coating film of the present invention.

The FWHM in X-ray diffraction is an angular difference $2\theta$ at half maximum (fmax/2) of an XRD peak of an XRD pattern from the (hkl) plane when the peak is fitted with a pseudo-Voigt function. The FWHM is determined by this method in the description of the present invention, including the following description of the preferred embodiments.

It is preferable that the FWHM is not more than about $0.2°$, not more than about $0.15°$, or not more than about $0.13°$. An excessively great FWHM is not preferred because crystal grains are too small to sufficiently block propagation of cracks or the like, or a low-crystallinity amorphous structure undergoes crystallization, that is, makes a structural change in a high-temperature environment. A lower limit value of the FWHM is not particularly limited, but about $0.01°$ or about $0.03°$ is preferred. When the FWHM is excessively small, crystal grains are too large to form a randomly oriented isotropic grain structure.

(2) Degree of Orientation (F)

Orientation of the crystalline structure constituting the carbide coating film is determined, for example, by the degree of orientation (F) calculated based on an XRD pattern using the Lotgering method. As an F value is closer to 0, the crystalline structure has random orientation. On the other hand, as an F value is more distant from 0, the crystalline structure has a strong orientation. For example, a single-crystal structure has an F value of 1, and a completely randomly-oriented polycrystalline structure has an F value of 0. It is preferable that the degree of orientation (F) of the crystalline structure of the (111) plane including the (222) plane, or even any Miller plane, of the carbide coating film of the present invention falls within a range of from about $-0.2$ to about $0.2$, about $-0.15$ to about $0.15$, or about $-0.1$ to about $0.1$. To put it the other way around, it can be objectively said that when the degree of orientation (F) falls within such a range, the carbide coating film of the present invention has a "randomly-oriented" crystalline structure.

A specific method for calculating the degree of orientation (F) is as follows.

$$F=(P-P_0)/(1-P_0)$$

In this formula, each value corresponding to a Miller plane (h'k'l') is determined as follows.

$$P=I(h'k'l')/\Sigma I(hkl)$$

$$P_0=I_0(h'k'l')/\Sigma I_0(hkl)$$

wherein I (h'k'l'): a peak area ratio (or the sum of peak area ratios) corresponding to a certain Miller plane (h'k'l') obtained from an XRD pattern of a specimen to be analyzed (a carbide coating film), $\Sigma I$ (hkl): the sum of area ratios of peaks corresponding to all Miller planes shown on the XRD pattern of the specimen to be analyzed, $I_0$ (h'k'l'): a peak area ratio (or the sum of peak area ratios) corresponding to a certain Miller plane (h'k'l') obtained from an XRD pattern of an authentic sample (e.g., a randomly oriented carbide), $\Sigma I_0$ (hkl): the sum of area ratios of peaks corresponding to all Miller planes shown on the XRD pattern of the authentic sample.

It should be noted that an "area ratio" is a ratio of area of each peak to area of a strongest peak. This is expressed, for example, as a percent (%) of area of each peak when area of a strongest peak is taken as 100%.

For example, when an XRD pattern of a tantalum carbide coating film (2θ=30° to 80°) is obtained as shown in FIG. 1A, the degree of orientation F(200) in the (200) plane can be calculated as follows.

$$F(200)=(P(200)-P_0(200))/(1-P_0(200))$$

$$P(200)=I(200)/\Sigma I(hkl)$$

$$P_0(200)=I_0(200)/\Sigma I_0(hkl)$$

wherein $\Sigma I$ (hkl)=I (111)+I (200)+I (220)+I (311)+I (222) $\Sigma I_0$ (hkl)=$I_0$ (111)+$I_0$(200)+$I_0$(220)+$I_0$ (311)+$I_0$(222)

Similarly, the degree of orientation F(220) in the (220) plane, the degree of orientation F(311) in the (311) plane, etc. can be calculated.

When the degree of orientation in the (111) plane is calculated, a peak from the (222) plane is also shown in the above-mentioned XRD pattern. Therefore, the sum of a peak area ratio of the (111) plane and a peak area ratio of the (222) plane is used as I (111) or $I_0$ (111), which is used for obtaining P or $P_0$. That is to say, used as I (111) or $I_0$ (111) is I' (111)=I (111)+I (222), or $I_0$' (111)=$I_0$ (111)+$I_0$(222). Consequently, the degree of orientation F(111) in the (111) plane can be calculated as follows.

$$F(111)=(P(111)-P_0(111))/(1-P_0(111))$$

$$P(111)=I'(111)/\Sigma I(hkl)$$

$$P_0(111)=I_0'(111)/\Sigma I_0(hkl)$$

$$I'(111)=I(111)+I(222)$$

$$I_0'(111)=I_0(111)+I_0(222)$$

$I_0$ (h'k'l') and $\Sigma I_0$(hkl) can be calculated, for example, based on an XRD pattern of a raw material powder (especially powder including randomly-oriented crystal grains) of a carbide coating film used as an authentic sample. Detailed description of calculation of the degree of orientation (F) using the Lotgering method can be found, for example, in "Ceramic Dielectric Engineering (*Ceramic Yudentai Kougaku*)" (Kiyoshi OKAZAKI, Gakken-sha, p. 587).

(3) Film Thickness of Carbide Coating Film

Film thickness of the carbide coating film is not limited, but it is preferable that the film thickness is in a range of about 40 to about 300 μm or about 80 to about 200 μm. With an excessively small film thickness, gas barrier properties or the like of the carbide coating film is not always sufficient. With an excessively large film thickness, a great thermal stress is applied to the boundary between the carbide coating film and the graphite substrate due to a difference in linear thermal expansion coefficient and, as a result, cracks and peeling easily occur in such a carbide coating film. It should be noted that the film thickness of the carbide coating film mentioned in the description of the present invention is determined by observing a fracture surface through a scanning electron microscope (SEM).

(4) Carbide

The kind of carbide constituting the coating film of the present invention is not limited, but tantalum carbide (TaC or $Ta_2C$), which has the highest melting point, is typically employed. In addition to tantalum carbide, metal carbide having a high melting point such as niobium carbide (NbC or $Nb_2C$), tungsten carbide (WC or $W_2C$), and hafnium carbide (HfC or $Hf_2C$) are preferred as the carbide of the present invention. The carbide coating film of the present invention needs only to be at least one of these carbides and does not always need to be of a single kind.

Graphite Substrate

The graphite substrate according to the embodiment of the present invention includes isotropic graphite. Isotropic graphite is a generic term for a graphite material produced by cold isostatic pressing (CIP). This isotropic graphite substrate matches the isotropic carbide coating film of the present invention, and a synergistic action of the substrate and the coating film allows the high heat-resistant member of the present invention to exhibit good durability.

Generally, the graphite substrate has a linear thermal expansion coefficient of about 3.5 to $8.5 \times 10^{-6}$/K (measured from room temperature to 500 deg. C.). As the linear thermal expansion coefficient of the graphite substrate is closer to that of the carbide coating film, thermal stress to be applied to the boundary between the graphite substrate and the carbide coating film can be reduced.

Method for Producing High Heat-Resistant Member (1) Coating Step

The coating step is a step of coating a slurry containing carbide particles on a surface of a graphite substrate. Examples of the method for coating the slurry include brush coating, spray coating, and immersion coating. It is also possible to employ spin coating, which is to flow a slurry onto a surface of a rotating high-temperature-resistant substrate, thereby spreading the slurry on the substrate surface thinly and uniformly by centrifugal force.

Preferably, carbide particle packing density is not less than 60% or not less than 65% when the ideal bulk density of TaC, i.e. without porosity, is taken as 100%. With an excessively low particle packing density, stress applied by shrinkage in sintering is liable to cause anisotropy and cracks. A higher particle packing density is more preferred, but fine particles are necessary to increase the particle packing density to 74% or more.

Preferably the carbide particles in the slurry coating have a particle diameter of about 0.1 to about 0.5 μm or about 0.2 to about 0.4 μm. If the particle diameter is excessively small, carbide particles such as TaC particles aggregate in a slurry, so the particle packing density in a slurry coating decreases and a resulting carbide coating film easily cracks. An excessively great particle diameter is not preferred either because a highly oriented carbide coating film is easily formed. This particle diameter is determined by observation using an optical microscope.

Particle diameter control of the carbide particles can be made not only by using a raw material powder originally having a desired particle diameter but also by stirring during slurry preparation. For example, particle size reduction can be made by causing particles to collide against each other by using a ball mill, an ultrasonic homogenizer, or the like.

The particle packing density and the particle diameter of the carbide particles in the slurry coating affect the crystalline structure of the carbide coating film after sintering. This is because as the particle packing density in the slurry coating is lower, a greater amount of void is formed between the particles. When such a slurry-coated substrate is sintered, shrinkage and structural distortion increase, so stress applied by these causes defects such as cracks in a resulting carbide coating film. As a result, gas barrier properties of the coating film decreases. In addition, if the particle packing density in the slurry coating decreases, the directions of the carbide particles change during sintering, thereby causing anisotropy (orientation). Therefore, as mentioned before, a higher particle packing density in the slurry coating is more preferred.

The slurry is a material obtained by dispersing the aforementioned carbide particles (carbide powder/raw material powder) in a dispersion medium. This slurry appropriately contains a sintering agent, an organic binder, a solvent and so on, and is adjusted to have a suitable viscosity for coating.

When the carbide particles are contained in an amount of 55 to 80% by mass or 60 to 75% by mass when the total mass of the slurry is taken as 100% by mass, a uniform slurry coating can be efficiently formed.

The sintering agent (auxiliary agent powder) includes a transition metal having a melting point below sintering temperature of the carbide or a carbide of such a transition metal. Upon melting of the sintering agent during sintering, the carbide coating film can be denser, stabler and more homogeneous.

Preferably, the transition metal used for the sintering agent has a boiling point (B. P.) of 2,600 to 3,300 deg. C., melts in a sintering start temperature range of 1,400 to 1,700 deg. C. and sublimes during sintering (at a maximum sintering temperature) so as not to remain as impurities. Examples of such a transition metal include titanium (Ti), chromium (Cr), iron (Fe), cobalt (Co), and nickel (Ni). It is also possible to employ a transition metal carbide such as TiC, $Cr_{25}C_6$, $Fe_3C$, $Co_2C$ and $Ni_2C$. Preferably, the sintering agent is contained in an amount of 0.3 to 5% by mass when the total mass of the slurry is taken as 100% by mass.

The organic binder serves to control viscosity of the slurry and improve coating properties, stickiness and the like of the slurry. As the organic binder, it is possible to appropriately employ polymethyl methacrylate (PMMA), polyvinyl alcohol (PVA), polyvinyl butyral (PVB), methyl cellulose, ethyl cellulose, acetyl cellulose, phenol resin, urea resin, melamine resin and the like. Preferably the organic binder is contained in an amount of 0.1 to 3% by mass when the total mass of the slurry is taken as 100% by mass.

Employable as the solvent is an organic solvent such as dimethylacetamide, methyl ethyl ketone, 1,3-dioxolane, benzyl alcohol, ethanol, α-terpineol, and toluene. The solvent constitutes the remainder of the slurry, and if the content of the solvent has to be defined, preferably the solvent is contained in an amount of 20 to 40% by mass when the total mass of the slurry is taken as 100% by mass.

(2) Film-Forming Step

The film-forming step is a step of forming a carbide coating film including sintered carbide particles on a surface of the graphite substrate by heating the slurry coating on the graphite substrate after the coating step. Preferably sintering temperature is 2000 to 2800 deg. C or 2300 to 2700 deg. C. With an excessively low sintering temperature, the carbide coating film cannot be dense. On the other hand, with an excessively high sintering temperature, the crystalline structure is coarsened.

Sintering time depends on sintering temperature, etc., but is generally about 0.5 to 3 hours. Preferably, the sintering atmosphere is a vacuum or an inert gas atmosphere of 1 to 95 kPa.

Industrial Applicability

The high heat-resistant member of the present invention can be used for high-temperature crucibles (especially graphite crucibles), high-temperature heaters, high-temperature filaments, susceptors for chemical vapor deposition (CVD) and so on. More specifically speaking, the high heat-resistant member of the present invention is effectively usable for resistant heaters to be used in corrosive atmospheres, crucible members for SiC single crystal growth by sublimation, crucible members for AlN single crystal growth by sublimation, susceptor members for SiC CVD epitaxial growth, susceptor members for group III nitride MOCVD epitaxial growth, hearth liners for electron beam evaporation, and so on.

PREFERRED EMBODIMENTS OF THE PRESENT INVENTION

Production of Specimens

<Specimen No. 1>
(1) Slurry Preparation

A TaC particle (carbide particle)-dispersed slurry was prepared as follows. The mixing ratio of each raw material is expressed as % by mass (hereinafter simply referred to as %) when the total mass of the slurry is taken as 100% by mass.

69% of TaC powder (purity: 99.9%/particle diameter: 1 to 2 μm) as carbide powder, 0.7% of Co powder (average particle diameter: 5 μm) as auxiliary agent powder, 0.7% of polymethyl methacrylate (PMMA) as an organic binder, 5.6% of dimethylacetamide, 12% of methyl ethyl ketone, and 12% of 1,3-dioxolane as organic solvents were respectively weighed. After these raw materials were mixed by a mixer, the powders in the mixture were dispersed and comminuted by an ultrasonic homogenizer. A slurry containing tantalum carbide (TaC) particles as amain component was thus obtained. It should be noted that particle diameter of TaC particles (average particle diameter of TaC powder) was determined by SEM.

(2) Coating Step

The obtained slurry was coated on a graphite substrate (isotropic graphite having a linear thermal expansion coefficient of $6.5 \times 10^{-6}$/K) by spray coating. This slurry coating had a TaC particle packing density of 65 to 70%, and the TaC particles had a diameter of 0.2 to 0.4 μm. This particle packing density can be calculated by the following formula, upon measuring film thickness and mass of the slurry coating. First, ideal film thickness D (film thickness at a particle packing density of 100%) is calculated by the formula:

$$D = (W/\rho)/S$$

wherein W=mass of the slurry coating, ρ=density of a material constituting the slurry coating, and S=coated area. Second, actual film thickness Dm is measured by observing a fracture surface by SEM. Finally, the particle packing density f is calculated by the formula:

$$f = (D/Dm) \times 100 (\%)$$

On the other hand, the particle diameter of TaC particles in the slurry coating is determined by observation through an optical microscope. It should be noted that the reason why the abovementioned particle packing density and the particle diameter had certain ranges lies in measurement accuracy. For example, even though the calculated particle packing density was 67%, the particle packing density is expressed as 65 to 69% as mentioned above because of a margin of measurement error of about ±2%. Similarly, even though the measured particle diameter was 0.3 μm, the particle diameter is expressed as 0.2 to 0.4 μm as mentioned above because of a margin of measurement error of about ±0.1 μm.

(3) Film-Forming Step

The slurry coating on the graphite substrate was dried by heating around 200 deg. C. (a drying step). The solventevaporated coating was further heated (sintered) to form a film (a film-forming step). This sintering was carried out using a high frequency heating furnace in an argon atmosphere (5 kPa), at a sintering temperature of 2,500 deg. C., for a sintering time (time kept at a maximum sintering temperature) of 1 hour. An almost uniform coating film (a tantalum carbide coating film) having a thickness of 100 μm was thus formed on a surface of the graphite substrate. This was used as a specimen (a high heat-resistant member). It should be noted that the abovementioned film thickness was measured by a micrometer (hereinafter the same shall apply).

<Specimen No. 2>

This specimen was produced by the same method as that of specimen No. 1, except that 0.7% of polyvinyl butyral (PVB) was used as an organic binder and 5.6% of benzyl alcohol, 12% of ethanol, and 12% of toluene were used as organic solvents. Thus obtained was a specimen (a high heat-resistant member) in which a tantalum carbide coating film (a carbide coating film) having an almost uniform film thickness of 100 μm was formed on the graphite substrate.

<Specimen No. C1>

Another specimen was also produced by forming a tantalum carbide coating film having a film thickness of 30 μm on the abovementioned graphite substrate by the chemical vapor deposition (CVD) method. Outline of this film-forming method is as follows. A substrate including an isotropic graphite material of 70 mm×70 mm×5 mm thick was placed in a vacuum heating furnace and a mixed gas of $TaCl_5$, $CH_4$, and $H_2$ was supplied into the furnace to make a thermal decomposition reaction and yield TaC, thereby forming a TaC coating film. For reaction conditions, pressure: 500 Pa, temperature: 1,150 deg. C., $TaCl_5$ flow rate: 100 cc/min, $CH_4$ flow rate: 200 cc/min, $H_2$ flow rate: 400 cc/min, and reaction time: 2 hours.

<Specimen No. C2>

This specimen was produced by a similar method to that of specimen No. 1, but there were several differences. First, 0.7% of polyvinyl butyral (PVB) was used as an organic binder and 5.6% of α-terpineol and 24% of ethanol were used as organic solvents.

Next, this slurry coating was observed and measured by a similar method to those of specimen No. 1 and the like. The TaC particle packing density was 55 to 60% and TaC particles had a particle diameter of 1 to 2 μm, which was almost the same as that of the raw material powder. The methods for determining the particle packing density and the TaC particle diameter were the same as those of specimen No. 1.

Then, sintering (film forming) of the slurry coating was conducted in an Argon atmosphere (80 kPa). Thus obtained was a specimen in which a tantalum carbide coating film (a carbide coating film) having a film thickness of 100 μm was formed on a surface of the graphite substrate.

Measurement, Observation, Test of Specimens (1) X-Ray Diffraction (XRD)

XRD patterns of the carbide coating films of the respective specimens obtained by radiating X-rays are shown in FIGS. 1A to 1D. Degree of orientation (F) by the Lotgering method and FWHM calculated based on these XRD patterns of the respective specimens are respectively shown in Tables 1 and 2. Calculation of the degree of orientation (F) was carried out according to the aforementioned method.

Figure 2A:
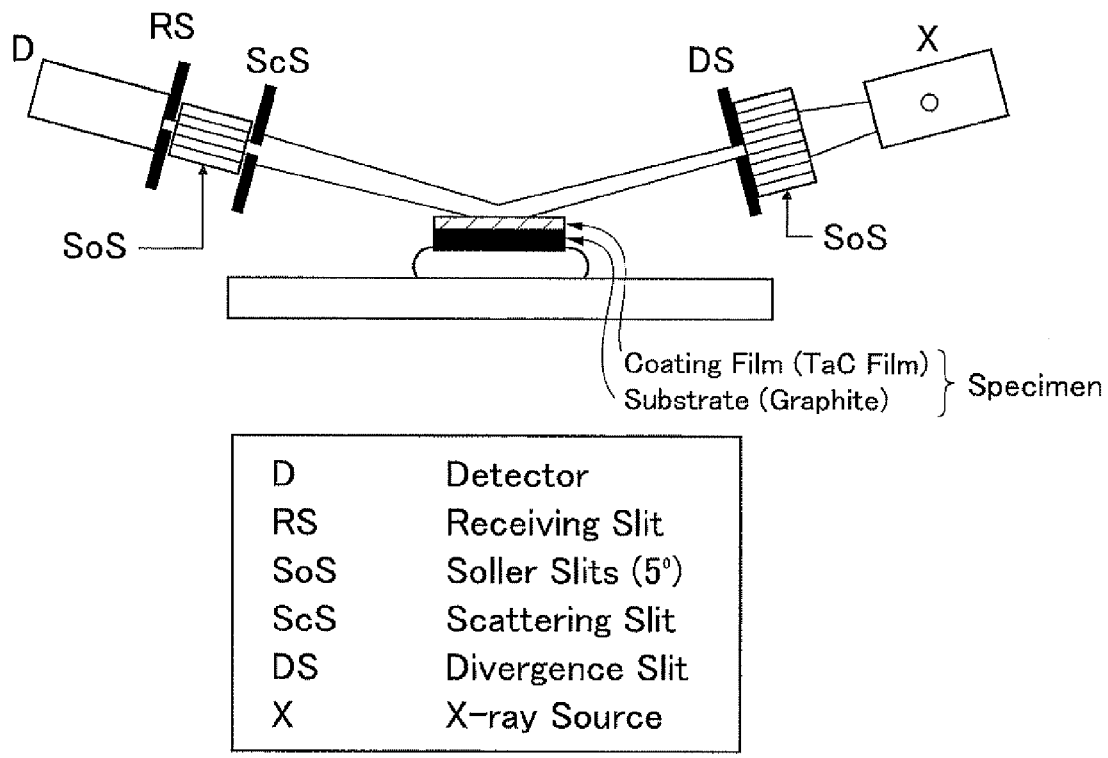
FIG. 2A is an explanatory diagram schematically showing an X-ray diffractometer.
Figure 2B:
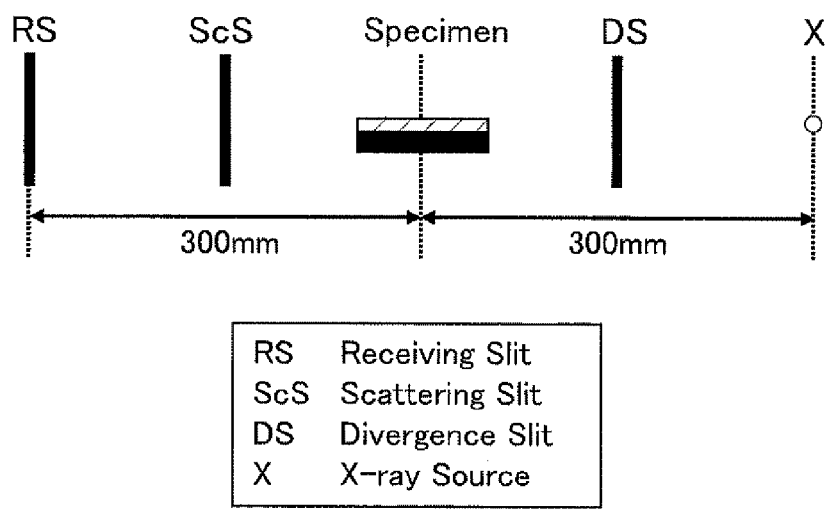
FIG. 2B is an explanatory diagram illustrating schematic layout of a specimen and slits in the X-ray diffractometer shown in FIG. 2A.
Figure 2C:
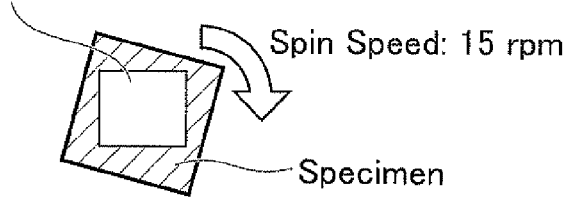
FIG. 2C is a top view of a specimen to be analyzed by the X-ray diffractometer shown in FIG. 2A illustrating spinning and X-ray radiated area of the specimen.

It should be noted that the XRD patterns of the respective specimens were obtained using an X-ray diffractometer ("D8 Advance" produced by Bruker AXS, Inc.) in the para-focusing Bragg-Brentano geometry. CuKα was employed as an X-ray source. Schematic layout of slits in this measurement is shown in FIGS. 2A to 2C. Additionally speaking, a divergence slit and a receiving slit were adjusted so that X-ray radiated area of each specimen would always be 20 mm×20 mm. Therefore, each of the divergence slit and the receiving slit had a variable width, but width of a scattering slit was fixed at 8 mm. Such an increase in X-ray radiated area of a specimen allowed precise evaluation of an obtained XRD pattern even when coarse crystalline grains are contained in the specimen (a carbide coating film). Measurement was carried out by continuous scanning at step width: 0.05°, scan speed: 4°/min, 2θ: 30 to 80° and specimen spin speed: 15 rpm. Less-biased XRD patterns were obtained owing to continuous spinning of each specimen during measurement as shown in FIG. 2C.

Figure 2D:
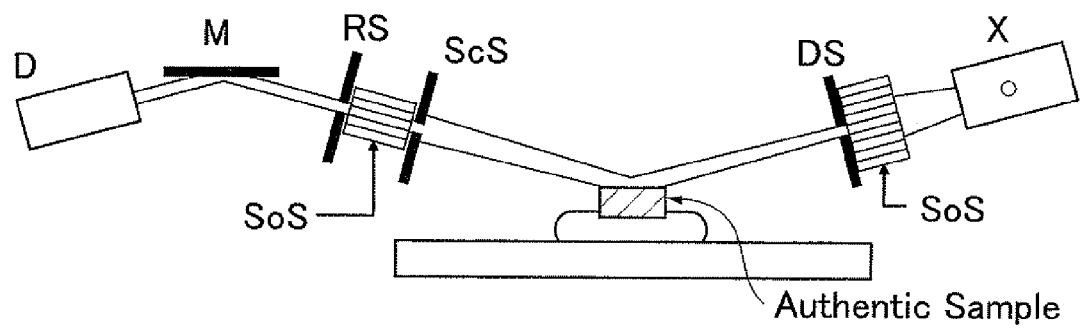
FIG. 2D is an explanatory diagram schematically showing an X-ray diffractometer for measuring an authentic sample.
Figure 2E:
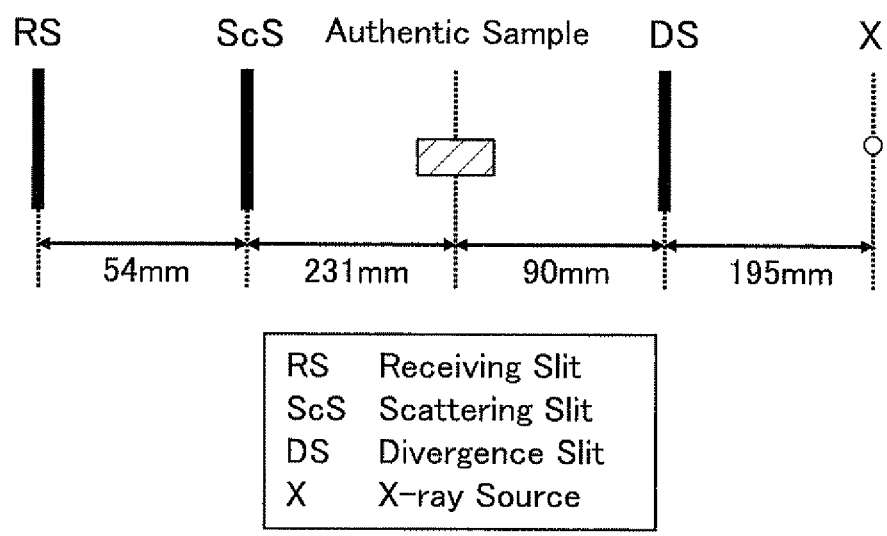
FIG. 2E is an explanatory diagram illustrating schematic layout of the authentic sample and slits in the X-ray diffractometer shown in FIG. 2D.

An XRD pattern of an authentic sample (TaC powder) was obtained using a common horizontal-sample-mounting powerful X-ray diffractometer ("RINT-TTR II" produced by Rigaku Corporation) in para-focusing Bragg-Brentano geometry. Since TaC powder had a particle diameter of not more than 2 μm, a sufficiently high precision was obtained by the above method. Schematic layout of slits in this measurement is shown in FIGS. 2D and 2E. Additionally speaking, a divergence slit: ½°, a vertical divergence slit: 10 mm, a scattering slit: ½°, and a receiving slit: 0.15 mm. Intensity of an X-ray beam to be radiated on the sample was adjusted by width of the vertical divergence slit. Measurement was carried out by continuous scanning at step width: 0.05°, scan speed: 4°/min, and 2θ: 30 to 80°. It should be noted that CuKα was employed as an X-ray source.

(2) SEM Observation

Figure 3A:
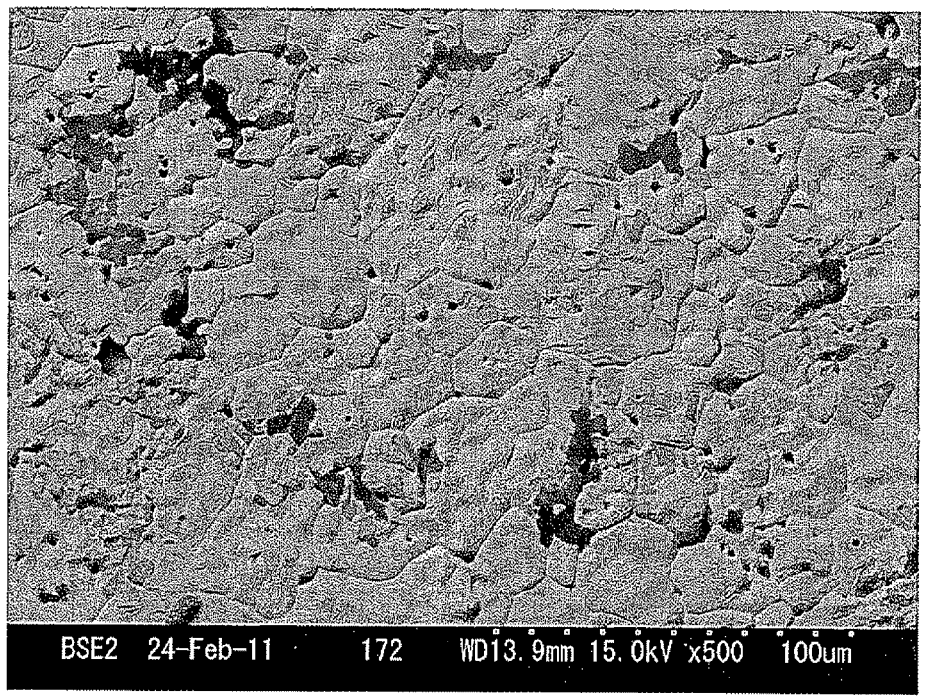
FIG. 3A shows an SEM image of specimen No. 1.
Figure 3B:
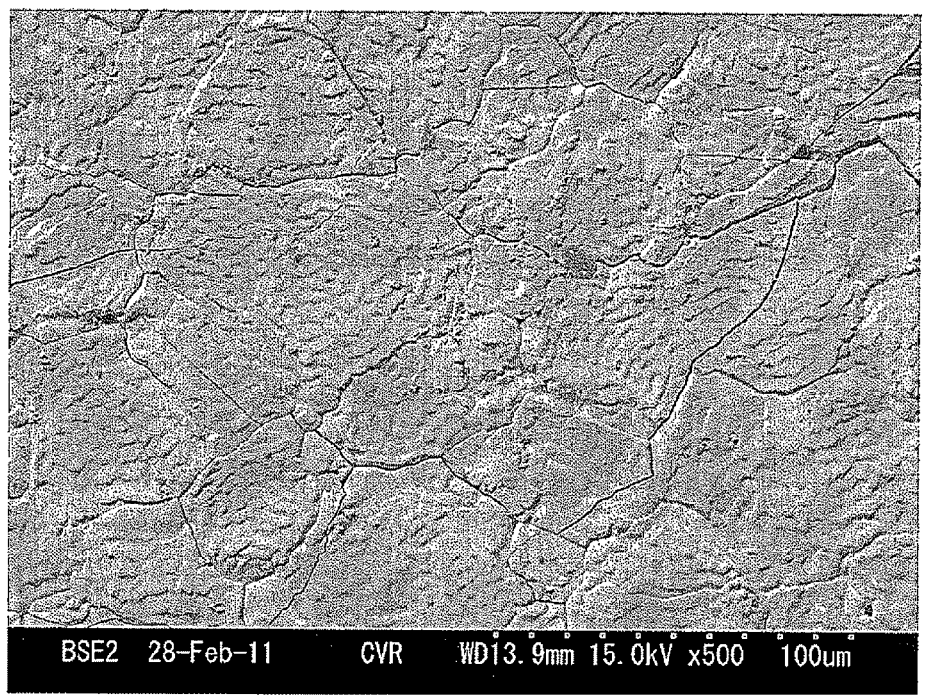
FIG. 3B shows an SEM image of specimen No. C1.

SEM images of surfaces of specimen Nos. 1 and C1 (before a heating test) are respectively shown in FIGS. 3A and 3B.

(3) Heating Test

The respective specimens were heated at 1500 deg. C. (heater temperature) in an ammonia atmosphere (nitrogen: 90%, ammonia: 10%, 100 kPa) for 10 hours. Whether there were cracks in the coating films or not, whether the coating films were peeled off or not, whether the substrates corroded or not were determined by observing the respective specimens after the heating test.

Evaluation (1) As apparent from Table 1, the degree of orientation (F) in any Miller plane of the tantalum carbide coating films of specimen Nos. 1 and 2 was within a range of −0.2 to 0.2. On the other hand, the degree of orientation (F) in the (111) plane of the coating films of specimen Nos. C1 and C2 was outside of the range of −0.2 to 0.2. It should be noted that the degree of orientation in the (111) plane is a sum of the degree of orientation in the (111) plane and the degree of orientation in the (222) plane.

Furthermore, as apparent from Table 2, the FWHM of diffraction peak from any Miller plane, including the (111) plane, of the tantalum carbide coating films of specimen Nos. 1, 2, C2 was less than 0.2°. On the other hand, the FWHM of diffraction peak from any Miller plane, including the (111) plane, of the tantalum carbide coating film of specimen No. C1 was more than 0.2°.

(2) As apparent from FIGS. 3A and 3B, no cracks were observed in the coating film of specimen No. 1, but cracks occurred in the coating film of specimen No. C1.

(3) Even after the abovementioned heating test, none of (surface) cracks, peeling of the coating films, and corrosion of the substrates (damage of the graphite substrates) was observed in the coating films of specimen Nos. 1 and 2. On the other hand, although no peeling was observed, cracks and corrosion of the substrate were observed in the coating film of specimen No. C1. Cracks were observed but neither peeling nor corrosion of the substrate was observed in the coating film of specimen No. C2.

Figure 4A:
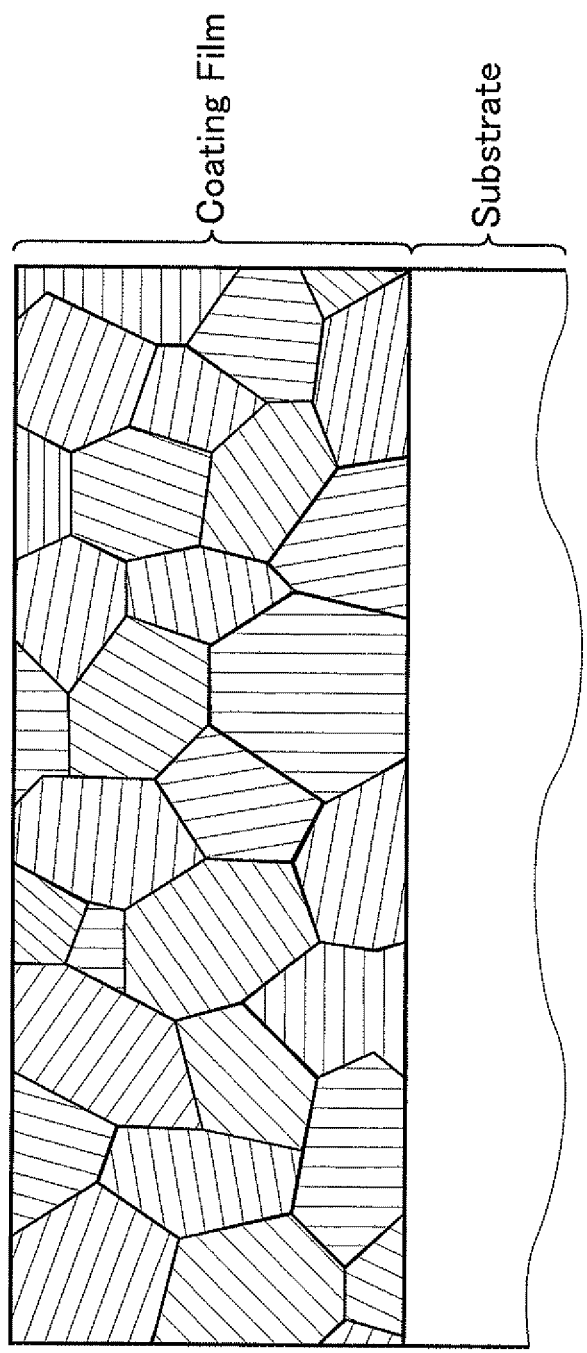
FIG. 4A is an explanatory diagram schematically illustrating a randomly oriented isotropic grain structure of a carbide coating film of the present invention.

These differences are believed to be caused by a difference in the crystalline structure constituting the coating films of the respective specimens as mentioned below. That is to say, as apparent from the abovementioned degree of orientation (F) and the FWHM, the tantalum carbide coating films of specimen Nos. 1 and 2 had a randomly oriented isotropic grain structure in which TaC crystal grains having an appropriate size are accumulated or laminated at random (see FIG. 4A).

On the other hand, the coating film of specimen No. C1 had a [111]-oriented crystalline structure. The crystalline structure was fine and crystallinity was poor. That is to say, it can be said that the coating film of specimen No. C1 is an oriented structure axially grown perpendicular to a surface of the graphite substrate or a columnar structure (see FIG. 4B).

It is assumed from the FWHM that the coating film of specimen No. C2 had not a grown columnar structure like that of specimen No. C1 but an isotropic grain structure, but it can be said from a relatively great degree of orientation (F) that the coating film of specimen No. C2 had an oriented structure. In this respect, the coating film of specimen No. C2 is widely different from those of specimen Nos. 1 and 2.

An oriented structure such as those of specimen Nos. C1 and C2 has anisotropic characteristics and easily generates cracks in a certain direction. For example, when thermal stress acts on the coating film of specimen No. C1, it is believed that cracks easily occur along cleavage planes and cracks once made are liable to propagate through crystal grain boundaries, penetrate through the coating film and reach the graphite substrate.

In contrast, in a randomly oriented isotropic grain structure such as those of specimen Nos. 1 and 2, characteristics are isotropic and therefore, even if thermal stress acts on a coating film having such a structure, cracks are difficult to occur along grain boundaries or cleavage planes, and even if cracks occur, the cracks are difficult to be developed. That is believed to be the reason why the high heat-resistant members having the coating films of specimen Nos. 1 and 2 exhibited good heat resistance and durability.

In the coating film of specimen No. C2, it is believed that cracks occurred due to an oriented structure, but owing to an isotropic grain structure the cracks were not developed and as a result neither peeling of the coating film nor corrosion of the substrate occurred.

Graphite Crucible (1) Production

Graphite crucibles having inner surfaces covered with the respective carbide coating films of specimen Nos. 1 to C2 were respectively produced. The graphite crucibles had a bottomed cylindrical shape, an outer diameter of 100 mm, a wall thickness of 10 mm, a bottom thickness of 10 mm, and a height of 120 mm. It should be noted that employed as substrates were commercially available graphite crucibles.

(2) Durability

An experiment of growing AlN single crystal by sublimation was carried out by filling AlN powder in the respective crucibles and heating insides of the crucibles under a nitrogen atmosphere ($N_2$/80 kPa) at 2300 deg. C. for 24 hours.

In the graphite crucibles having the coating films of specimen Nos. 1 and 2, none of the surface cracks, peeling of the coating films, and corrosion of the substrates occurred even after the abovementioned growth experiment.

On the other hand, in the graphite crucible of specimen No. C1, surface cracks, peeling of the coating film, and corrosion of the substrate occurred. The corrosion of the graphite substrate was especially strong, and it is believed that this corrosion caused peeling of the coating film. In the graphite crucible of specimen No. C2, peeling of the coating film did not occur but surface cracks and corrosion of the substrate were observed.

A difference in durability between the crucibles of specimen Nos. 1 and 2 and those of specimen Nos. C1 and C2 is believed to have been caused by a difference in the crystalline structure of the tantalum carbide coating films as mentioned before.

Single Crystal Ingot

As demonstrated by the above experiment, the graphite crucibles of the present invention were free from surface cracks or peeling of the coating films even used in a high-temperature environment, that is, had good high-temperature durability. Upon using these graphite crucibles, for example, a single crystal ingot of SiC, AlN, or the like can be produced with high quality at low costs. As an example, a method for producing an SiC single crystal ingot will be described below.

First, SiC single crystal (a seed crystal) and SiC crystal powder (a raw material) are placed in a graphite crucible having the coating film of specimen No. 1 or 2, in a manner to face each other (a placing step). Second, these are heated in an inert atmosphere (e.g., an argon gas atmosphere of about 100 Pa to 15 kPa) at a high temperature (e.g., 2000 to 2400 deg. C.) (a heating step).

Upon heating, SiC gas which has sublimed from the raw material diffuses and is delivered toward the seed crystal due to concentration gradient and recrystallizes on the seed crystal. As a result, the seed crystal grows and a SiC single crystal ingot is obtained.

It should be noted that the abovementioned inert atmosphere is not limited to argon gas and can be nitrogen gas, hydrogen gas or a mixture thereof. An AlN single crystal ingot can be produced by a similar method to that of a SiC single crystal ingot, but in this case, it is preferable that the inert atmosphere is a nitrogen gas atmosphere (e.g., 10 Pa to 95 kPa).

Moreover, it is possible to control resistivity of single crystal to be obtained by mixing impurity gas in an atmosphere gas or mixing impurity elements or a compound other than SiC in a raw material.

In any case, upon producing single crystal ingots by the aforementioned production method using the graphite crucible of the present invention having good high-temperature durability, production costs of the single crystal ingots can be reduced because the graphite crucible can be repeatedly used.

TABLE 1

| SPECIMEN NO. | DEGREE OF ORIENTATION (F) IN MILLER PLANE | | | | | |
|---|---|---|---|---|---|---|
| | (111) | (200) | (220) | (311) | (222) | (111) + (222) |
| 1 | −0.07 | 0.074 | −0.013 | 0.00 | 0.002 | −0.073 |
| 2 | −0.124 | 0.039 | −0.015 | 0.050 | 0.021 | −0.102 |
| C1 | 0.531 | −0.292 | −0.098 | −0.146 | 0.097 | 0.743 |
| C2 | −0.208 | −0.065 | 0.049 | 0.152 | 0.012 | −0.209 |
| AUTHENTIC SAMPLE | 0 | 0 | 0 | 0 | 0 | 0 |

TABLE 1-continued

| | DEGREE OF ORIENTATION (F) IN MILLER PLANE | | | | | |
|---|---|---|---|---|---|---|
| SPECIMEN NO. | (111) | (200) | (220) | (311) | (222) | (111) + (222) |
| (TaC POWDER) | | | | | | |

TABLE 2

| | FWHM IN MILLER PLANE (°) | | | | |
|---|---|---|---|---|---|
| SPECIMEN NO. | (111) | (200) | (220) | (311) | (222) |
| 1 | 0.148 | 0.143 | 0.146 | 0.17 | 0.186 |
| 2 | 0.105 | 0.097 | 0.109 | 0.119 | 0.122 |
| C1 | 0.245 | 0.437 | 0.361 | 0.431 | 0.491 |
| C2 | 0.105 | 0.083 | 0.101 | 0.096 | 0.082 |
| AUTHENTIC SAMPLE (TaC POWDER) | 0.29 | 0.28 | 0.47 | 0.493 | 0.563 |

The invention claimed is:

1. A high heat-resistant member, comprising:
a graphite substrate comprising isotropic graphite; and
a carbide coating film comprising a carbide and covering a surface of the graphite substrate;
the carbide coating film having a randomly oriented isotropic grain structure in which crystallites having a size indexed by a full width at half maximum of a diffraction peak of an X-ray diffraction pattern of not more than about 0.2° from (111) planes are accumulated at substantially random,
wherein a degree of orientation (F) in all Miller planes of the carbide coating film calculated based on the X-ray diffraction pattern using the Lotgering method is within a range of from about −0.2 to about 0.2.

2. The high heat-resistant member according to claim 1, wherein the carbide is at least one selected from the group consisting of tantalum carbide, niobium carbide, tungsten carbide and hafnium carbide.

3. The high heat-resistant member according to claim 1, wherein the carbide coating film has a thickness of about 40 to about 300 μm.

4. A method for producing the high heat-resistant member according to claim 1, comprising:
coating a slurry containing carbide particles on a surface of a graphite substrate comprising isotropic graphite; and
forming a carbide coating film comprising sintered carbide particles by heating the graphite substrate after coating the surface of the graphite substrate with the slurry.

5. A graphite crucible, comprising the high heat-resistant member according to claim 1.

6. A method for producing a single crystal ingot, comprising:
placing a seed crystal and a raw material in the graphite crucible according to claim 5 in a manner to face each other; and
heating the raw material in an inert atmosphere so as to sublime the raw material,
thereby obtaining a single crystal ingot comprising single crystal grown from the seed crystal.

7. The high heat-resistant member according to claim 1, wherein the full width at half maximum of the diffraction peak of the X-ray diffraction pattern ranges from about 0.03° to not more than about 0.2°.

* * * * *